US005849106A

United States Patent [19]
Bolden et al.

[11] Patent Number: 5,849,106
[45] Date of Patent: Dec. 15, 1998

[54] CLEANING PROCESS

[75] Inventors: Paul L. Bolden; Michael E. Hayes; John E. Braddy, all of Fernandina Beach, Fla.

[73] Assignee: Petroferm Inc., Fernandina Beach, Fla.

[21] Appl. No.: 70,308

[22] Filed: May 26, 1993

Related U.S. Application Data

[63] Continuation-in-part of Ser. No. 620,500, filed as PCT/US91/08937 Nov. 29, 1991, Pat. No. 5,120,371.

[51] Int. Cl.[6] .................................. B08B 3/08; C11D 7/50
[52] U.S. Cl. ............................ 134/40; 510/175; 510/505
[58] Field of Search ................................. 134/38, 40, 42; 252/162, 170, DIG. 14; 210/800, 806; 510/505, 506, 175, 200, 201, 202, 437

[56] References Cited

U.S. PATENT DOCUMENTS

| | | | |
|---|---|---|---|
| 3,930,879 | 1/1976 | Erickson et al. | 134/10 |
| 4,000,065 | 12/1976 | Ladha et al. | 210/652 |
| 4,176,080 | 11/1979 | Wise et al. | |
| 4,180,472 | 12/1979 | Mitchell et al. | |
| 4,295,845 | 10/1981 | Sepulveda et al. | |
| 4,332,643 | 6/1982 | Reid | 203/18 |
| 4,740,247 | 4/1988 | Hayes et al. | 134/40 |
| 4,863,525 | 9/1989 | Goel et al. | 134/22.19 |
| 4,867,800 | 9/1989 | Dishart et al. | 134/40 |
| 4,917,807 | 4/1990 | Prisco, Jr. et al. | 210/805 X |
| 4,983,224 | 1/1991 | Mombrun et al. | 134/40 |
| 5,080,722 | 1/1992 | Englert et al. | 134/26 |
| 5,196,136 | 3/1993 | Dishart et al. | 252/170 |
| 5,230,821 | 7/1993 | Larson et al. | 252/170 |
| 5,248,343 | 9/1993 | Hamilton et al. | 134/10 |
| 5,271,773 | 12/1993 | Hamilton et al. | 134/10 |

FOREIGN PATENT DOCUMENTS

WO 90/03419  4/1990  WIPO ............................. C09D 9/00

*Primary Examiner*—Jill Warden
*Assistant Examiner*—Saeed Chaudhry
*Attorney, Agent, or Firm*—Synnestvedt & Lechner

[57] ABSTRACT

An industrial cleaning process in which a contaminant comprising soldering flux and/or adhesive tape residue is removed from a substrate contaminated therewith, for example, a printed circuit board contaminated with rosin flux, comprising: (A) contacting the substrate with a terpene-based cleaning composition which is substantially free of water-soluble organic material, for example, a surfactant, for a period of time sufficient to solubilize the contaminant; (B) removing the composition and solubilized contaminant from the substrate by contact with water having a temperature of about 70° F. to about 140° F. (but preferably lower) for a period of time of no longer than about 10 minutes to provide a substrate having a contamination rating of no greater than about 14 micrograms NaCl equivalent/square inch (MIL-P-28809A), and to thereby form a mixture comprising the composition, contaminant and water; and (C) separating the water from said mixture, the separated water being substantially free of water-soluble organic material and having a chemical oxygen demand of no greater than about 1,000 ppm. and also a cleaning process utilizing a cleaning composition comprising a major amount of a monobasic ester to clean surfaces that are contaminated with an organic residue.

25 Claims, No Drawings

CLEANING PROCESS

CROSS-REFERENCE TO RELATED APPLICATION

This application is a 371 of PCT/US91/08937 Nov. 29, 1991, which is a continuation-in-part of application Ser. No. 07/620,500, filed Nov. 29, 1990, now U.S. Pat. No. 5,120,371.

FIELD OF THE INVENTION

This invention relates to the removal of a residue from a surface that is contaminated therewith, for example, to the cleaning of deposits of soldering flux and/or other residues from a substrate which is contaminated therewith. More specifically, this invention relates to the use of a cleaning composition containing an ester. This invention relates also to the use of terpenes, preferably in admixture with an ester, in an improved cleaning process for removing contaminants such as soldering flux and/or adhesive tape residue from a substrate.

The invention will be described initially in connection with its applicability to the cleaning of printed circuit boards. However, the invention has wider applicability, as described hereinbelow.

In the fabrication of printed circuit boards, it is known to use soldering fluxes in order to ensure the firm, uniform bonding thereto of solder which functions to adhere to the boards components thereof. Such flux must be removed from the finished board. If not removed, deposits of the flux, in even trace or minute amounts, can cause the circuitry of the board to fail. An example of a flux that is widely used in the fabrication of printed circuit boards is rosin flux, a material which is water insoluble.

Various types of materials have been proposed for cleaning deposits of rosin flux from the surface of a printed circuit board. Traditionally, chlorofluorocarbons (CFCs) and other halogenated solvents, including chlorinated hydrocarbon solvents, were used widely. However, these materials are not presently favored because of environmental problems that are associated therewith. Examples of other cleaning materials for removing deposits of rosin flux from substrates contaminated therewith include: (a) alkaline cleaning compounds such as alkanol amines; (b) a mixture of N-methyl-2-pyrrolidine and an alkanol amine (U.S. Pat. No. 4,276,186); (c) terpene compounds; and (d) dibasic acid esters (U.S. Pat. No. 4,934,391).

Although there are advantages and disadvantages associated with the use of each of the aforementioned type cleaning materials, the use of terpene compounds in cleaning printed circuit boards of flux deposits has become more and more popular because they possess a combination of unusually desirable properties. The present invention is directed to an improved process for cleaning printed circuit boards and other substrates of deposits of soldering flux and/or other residues with a terpene-based cleaning composition which optionally, but preferably, includes an ester.

The present invention is directed also to the use of a non-toxic, environmentally safe cleaning composition comprising an ester and optionally other materials, for example, a terpene.

REPORTED DEVELOPMENTS

In the cleaning operation, deposits of soldering flux are dissolved by the water-insoluble, liquid cleaner, for example, terpene compounds as they are contacted therewith. A review of the related art reveals that special consideration is given to removing from the terpene-treated substrate the dissolved contaminants that adhere thereto for those applications which require that the substrate be highly cleaned. Thus, the effective removal of the dissolved soldering flux and the terpene solvent from the substrate in which the flux is dissolved is an important aspect of the overall cleaning process.

The basic patent on the use of terpenes to clean printed circuit boards of soldering flux is U.S. Pat. No. 4,640,719, assigned to the same assignee as the present invention. With respect to the removal from the terpene-treated substrate of dissolved flux and other contaminants, this patent teaches as follows:

"Because they [terpene compounds] are almost completely insoluble in water, however, the terpenes cannot be directly flushed away by water. Alternatively and preferably, the terpene compounds are combined with one or more terpene emulsifying surfactants. The addition of such surfactants facilitates removal of the terpenes from printed wiring boards by rinsing with water, whereby the terpenes are formed into oil-in-water emulsions." (Column 3, lines 54–62)

The U.S. Pat. No. '719 discloses further that the terpene-based composition can include up to 40 wt. % of the emulsifying surfactant, with a preferred composition containing 10 wt. % of surfactant. Such surfactants are typically water-soluble organic materials.

European patent application bearing publication number 0 354 027 A2 discloses cleaning compositions comprising a major amount of selected cyclic terpenes, including para-menthadienes, and a minor amount of terpene a alcohol for use in cleaning a variety of substrates, including circuit boards. This patent discloses that the compositions can include surfactants and specifically states the following:

"It has been found helpful to add surfactants to solvent compositions which are to be used in combination with a water rinse. It has been found that the addition of the surfactant to the cyclic terpene mixture enhances the water rinsability of the solvent composition. Further, it has been found that in dealing with certain types of soil, the addition of a surfactant to the mixture of cyclic terpenes enhances the ability of the cyclic terpene mixture to remove the soil from the substrate." (Column 4, line 57 to Column 5, line 1)

This publication discloses further that the surfactants can be used in concentrations of from 0.1 to 10 wt. %.

Another patent which relates to the removal of soldering flux from substrates such as printed circuit boards is U.S. Pat. No. 4,867,800. The cleaning composition which is the subject of this patent comprises a terpene compound and a dibasic ester which has at least 2 wt. % solubility in water at 25° C. This patent discloses that such compositions can be used to achieve improved cleaning relative to the use of terpene-based compositions that include emulsifying surfactants, which the patentee refers to as an unnecessary, but optional ingredient of his composition. The patent discloses also that the terpene-treated surface is preferably rinsed with water, such as deionized water. In an exemplary embodiment disclosed in the patent, the rinse water which was used in the cleaning process had a temperature of about 150° F.

A common characteristic of each of the processes described in the aforementioned publications is the required or preferred use of water-soluble organic materials in combination with the terpene constituent of the cleaning composition. While considered essential to achieve high grade cleaning, the presence of such water-soluble organic materials leads to problems which are associated with other aspects of the overall cleaning process.

One significant problem crops up in connection with disposal of the rinse water that is generated during the cleaning process. The amount of such rinse water can be substantial, with some industrial applications using, for example, two to five gallons of rinse water per minute of operating time. For various industrial applications, it is considered ideal to simply discharge the rinse water into the local sewage system. However, as a result of the use in the cleaning composition of water-soluble materials, such discharge typically runs afoul of environmental standards which require that the chemical oxygen demand (COD) of the discharged water be no greater than some defined value. For example, some communities specify that the COD should be no greater than about 1,000 ppm for industrial water that is discharged into the local sewage system. There are other communities with even higher standards, for example, CODs of no greater than about 300 ppm. However, in using cleaning compositions of the type described above, the presence of the water-soluble materials can result in the rinse water having as much as 10,000 ppm or more of COD. This indeed presents a problem for the fabricators of circuit boards inasmuch as it requires the fabricators to adopt additional steps to treat the water in a manner such that environmental standards are met. This, of course, increases the cost of the overall manufacturing process.

There are reports (unconfirmed) of the use of surfactant-free, terpene-based compositions in applications for removing solder fluxes from various types of substrates. However, it appears that, in such applications, the terpene-treated substrate is rinsed with surfactant-containing water or requires that the substrate be rinsed with either boiling water or near boiling water. This, of course, is undesirable because of the increased costs associated with the provision of energy that is needed to heat the significant amounts of water that are required for the rinsing operation.

In view of exemplary shortcomings of the present state of the art related to the use of terpene-based compositions to clean soldering flux from the surfaces of printed circuit boards, as described above, the present invention is directed to an improved, more efficient and economical process which avoids or significantly alleviates such shortcomings.

As mentioned briefly above, CFCs and other halogenated solvents which have been used widely as cleaning agents for many years are no longer materials of choice because of their detrimental effects on the earth's stratospheric ozone layer. Species of these materials are perceived also to be carcinogenic. Due to their environmental and health threats, they are being phased out of production even though they have a variety of properties which otherwise make them ideal cleaning agents. They are moderately good oil and grease solvents, they have no flash points, they evaporate quickly due to their high vapor pressures, and some have low toxicity.

Alkaline cleaning compounds known as the alkanol amines, usually in the form of monoethanolamine, have been used for rosin flux removal as an alternative to the toxic halogenated hydrocarbon solvents. These compounds chemically react with rosin flux to form a rosin soap through the process of saponification. Other organic substances such as surfactants or alcohol derivatives may be added to these alkaline cleaning compounds to facilitate the removal of such rosin soap. The use of N-methyl-2-pryrrolidone in admixture with a water-miscible alkanolamine is disclosed in U.S. Pat. No. 4,276,186. Unfortunately, these compounds, like the water soluble soldering fluxes, have a tendency to cause corrosion of the surfaces and interfaces of printed wiring boards if they are not completely and rapidly removed during the fabrication process.

Another material which has been identified as an alternative to the use of halogenated solvents is the class of compounds known as dibasic esters. The use of these materials is desirable because they have relatively high flash points and are not skin irritants. However, they have the disadvantage of being moderately water soluble. Water solubility is undesirable because dissolved materials are difficult to separate from the water when used in a process involving water rinse (as is usually the case). Thus, it is difficult to dispose of the water rinse generated in the cleaning process. Closed-loop systems are relatively difficult and/or expensive to install when the cleaning compound is substantially water soluble.

Even terpenes, which have been recognized as environmentally acceptable alternatives to halogenated solvents and which offer good performance in a wide range of cleaning applications, have some disadvantages. They have an objectionable odor, low flash point, and a tendency to irritate skin, lungs and nasal passages.

Still another class of compounds in use is mineral spirits or other petroleum distillates. These materials often have low flash points, with high evaporative loses, and produce dermatitis, headaches and nausea in use. Petroleum distillates also require frequent change-outs in use because their cleaning power is greatly diminished with minor loadings of oil and machine residues.

The present invention encompasses also the provision of a cleaning process involving the use of a cleaning agent which has a combination of properties such that the agent is particularly suitable for safe and efficient use in a wide variety of cleaning processes.

SUMMARY OF THE INVENTION

In accordance with the present invention, it has been found that a composition comprising a major amount of a monobasic ester can be used effectively in a variety of different types of cleaning applications which heretofore involved the use of halocarbons, alkaline detergents, or other cleaning agents as described above, the use of each of the aforementioned being accompanied by serious disadvantages. The monobasic esters, which can be used to clean a variety of surfaces, for example, metals, plastics, and electronic assemblies, offer the advantage of water insolubility, low toxicity, low skin irritation, high flash point and low odor.

Accordingly, there is provided, in accordance with the present invention, a method for removing an organic residue from a surface contaminated therewith comprising:

(A) contacting the surface with a cleaning composition comprising a major amount of a monobasic acid ester;

(B) maintaining the cleaning composition in contact with the surface for a period of time at least sufficient to solubilize the residue; and (C) removing cleaning composition and solubilized residue from the surface.

Examples of monobasic esters that can be used in the cleaning operation are methyl, ethyl, and isopropyl esters of medium chain (about $C_8$ to about $C_{18}$) monobasic acids.

The conditions under which the monobasic ester composition are used can be typical of conditions used for other organic cleaning solvents. They can be used, for example, at a temperature within the range of room temperature to about 150° F. or higher and under conditions which involve a contact time of about 1 to about 10 minutes. Conventional means can be used to apply the monobasic ester composition to the soiled substrates, for example, spray, agitated immersion, and soaking.

Use of the monobasic ester composition of the present invention avoids disadvantages associated with the use of prior art compositions, as noted above. Use of a composition within the scope of the present invention offers the advantages of: (a) good oil solvency; (b) good solvency for solder fluxes; (c) excellent ability to remove lapping compounds, chips, grinding residues and other solid materials from metal surfaces after machining operations; (d) the ability to remove the solids even though highly loaded with cutting oils; (e) extremely low toxicity and skin irritance; (f) low odor or pleasing fragrances; (g) high flash points; and (h) water insolubility. Furthermore, the monobasic ester composition does not have a harmful effect on the earth's stratospheric ozone layer and they generally have a relatively low vapor pressure, and are, therefore, less volatile, providing the advantage of lower volatile organic compound (VOC) pollutant emissions than prior art compositions.

In addition, there is provided in accordance with the present invention an industrial cleaning process in which a contaminant comprising soldering flux and/or adhesive tape residue is removed from a substrate contaminated therewith comprising:

(A) contacting the substrate with a terpene-based cleaning composition which is substantially free of water-soluble organic material for a period of time sufficient to solubilize the contaminant;

(B) removing the composition and solubilized contaminant from the substrate by contact with water having a temperature of about 70° F. to about 140° F. for a period of time of no longer than about 10 minutes to provide a substrate having a contamination rating of no greater than about 14 micrograms NaCl equivalent/square inch (MIL-P-28809A), and to thereby form a mixture comprising the composition, contaminant and water; and (C) separating the water from said mixture, the separated water being substantially free of water-soluble organic material and having a chemical oxygen demand of no greater than about 1,000 ppm.

With respect to Step (A) above, the following procedure is used to determine the content of water-soluble organic material in a terpene-based composition. Equal volumes of water and the terpene-based composition are combined and allowed to separate into two distinct phases or layers at about 70° F. To the extent that the terpene-based composition contains water-soluble organic material, it will migrate to the water layer. The COD of the water layer is then determined according to standard technique. When the water layer has a COD of no greater than about 1,000 ppm, the terpene-based composition is considered to be "substantially free of water-soluble organic material".

Thus, in accordance with the present invention, it has been found, contrary to the teachings of the prior art, that it is possible to produce a highly clean surface by the use of a terpene-based cleaning composition which is free of or essentially free of emulsifying surfactants and/or other water soluble organic materials.

And such highly cleaned surfaces can be produced under practical operating conditions, for example, at ambient temperature or relatively low elevated temperature and within times and water contact conditions that are presently used in industrial applications. And of great advantage is the fact that the water collected from the cleaning process has a sufficiently low COD to enable it to be lawfully discharged to a sewage system without purification or other treatment. Alternatively, the collected water can be recycled for use in the cleaning process, as described hereinbelow.

With respect to the high degree of cleaning that can be achieved by use of the present invention, the present cleaning process, including either the monobasic ester-based composition or the terpene-based composition, can be used to produce levels of residual contamination that are equal to or far below the military requirement of 14 micrograms NaCl equivalent/in$^2$ (MIL-P-28809A) (see the aforementioned U.S. Pat. No. '719, column 7, lines 18 to 32 for additional information concerning the evaluation of the degree of cleanliness of substrates based on the involved military test). A specific example of the degree of cleanliness that can be achieved by practice of the present invention is set forth in the Example section hereinbelow.

DETAILED DESCRIPTION OF THE INVENTION

The Monobasic Ester Development

The cleaning composition of the present invention comprises a major amount of a monobasic ester compound, that is, the ester compound comprises in excess of 50 wt. % of the composition, based on the total weight of the composition. The ester compound, which is a liquid at room temperature, can be represented by the following formula:

wherein R and $R_1$ are hydrocarbon groups, which may be the same or different, in which the sum of the carbon atoms in R and R1 is at least about 8. The hydrocarbon groups can be aliphatic or aromatic, substituted or unsubstituted. Examples of aromatic groups include aryl groups, for example, phenyl and benzyl. In preferred form, each of R and $R_1$ is an alkyl group with the total number of carbon atoms in R and R1 being no greater than about 20. The alkyl groups can be straight or branched chain and unsubstituted or substituted, for example, with groups such as hydroxyl and ether groups. The cleaning composition can comprise two or more of the monobasic esters.

Particularly preferred monobasic esters for use in the practice of the present invention are those in which the total number of carbon atoms in R and $R_1$ is about 9 to about 17, with $R_1$ being an alkyl group having 1 to about 4 carbon atoms and R being an alkyl group having about 8 to about 16 carbon atoms. Particularly preferred monobasic esters are methyl laurate and isopropyl laurate, with methyl caprate and isopropyl myristate being even more preferred. The preferred esters are excellent solvents for a variety of different kinds of organic residues that typically contaminate the surfaces of a variety of types of materials.

Examples of commercially available monobasic esters which can be used in the practice of the present invention include: methyl caprylate, methyl caprate, methyl laurate, methyl palmitate, isopropyl myristate, isopropyl laurate and isopropyl stearate.

It will be appreciated that a particular carboxylic monobasic ester can be synthesized readily by available methods. For example, monobasic esters can be prepared by reacting an alkyl alcohol and a fatty acid, for example, a $C_1$ to about a $C_8$ alkanol and about a $C_3$ to about a $C_{18}$ fatty acid.

The insolubility of the ester is determined by the following procedure which is conducted at about 70° F. Equal volumes of water and the ester are combined and allowed to separate into two distinct phases or layers. The chemical oxygen demand (COD) of the water layer is then determined according to standard technique. If the water layer has a COD of no greater than about 5,000 ppm, the ester is considered to be "substantially insoluble in water". Preferably the solubility characteristics of the ester are such that the water layer has a COD of no greater than about 1,000 ppm—such esters being referred to as "water-insoluble".

Other preferred properties of the ester are that it have a flash-point of greater than about 140° F., preferably greater than about 200° F., and low odor. In addition, the ester should be non-irritating to the skin and have good chemical stability.

The cleaning composition of the present invention can comprise 100 wt. % of the monobasic ester. However, there are applications in which it will be advantageous to include other materials in the composition, but in an amount less than 50 wt. %. For example, some types of residues can be removed more readily by using other cleaning agents, including, for example, organic or inorganic solvents, in admixture with the monobasic ester. In preferred form, such other cleaning agents should be miscible with the monobasic ester. Examples of other cleaning agents that can be used include terpenes, for example, para-menthadienes, dibaic esters, petroleum hydrocarbons, ketones, ethers, and alcohols. Preferred cleaning agents for use in combination with the monobasic ester are terpenes, ethers, and alcohols.

For applications in which it is desirable to use another cleaning agent in combination with the monobasic ester, the amount thereof can be selected based on the results desired. For most applications, it is believed that the composition will comprise about 55 to 90 wt. % of the monobasic ester and about 10 to about 45 wt. % of the other cleaning agent.

The organic-based cleaning composition of the of the present invention can include also a surfactant for promoting the removal of residual cleaning composition and contaminate from the substrate being cleaned. In some applications, the presence of surfactant aids also in the cleaning of contaminate from the substrate.

The surfactant can be a nonionic, anionic, cationic or amphoteric surfactant. It is preferred to use a nonionic surfactant, for example, condensation products of alkylene oxides, for example, ethylene oxide, with any of a variety of hydrophobic moieties, as are well known in the art. Examples of these products are ethoxylated aliphatic alcohols, ethoxylated alkylphenols, ethoxylated amines, amides, and the like. Sulfated, sulfonated, phosphated and carboxylated hydrophobes, such as alcohols, can also be used, as can the salts of each. Particularly preferred surfactants are ethoxylated aliphatic alcohols and their derivatives.

Examples of surfacatants that can be used are ethoxylated nonylphenols having about 4 to about 10 ethylene oxide groups and detergent alcohols, for example, those comprising about $C_9$ to about C15 linear alcohols and about 3 to about 10 ethylene oxide groups.

The proportion of surfactant comprising the composition will vary, depending on the particular ester or combination of esters used and the nature of the particular cleaning application. Generally the surfactant will comprise about 2 to about 20 wt % of the composition. In a highly preferred embodiment, the composition comprises a mixture of about 8 to about 12 wt. % of surfactant and about 88 to about 92 wt. % of monobasic ester.

The ester cleaning composition of this invention can be used in a wide variety of applications because the ester cleaning agent is capable of dissolving a wide variety of organic materials that typically contaminate substrates and it is compatible (not harmful) with many types of materials that comprise substrates that require cleaning. Thus, the ester-based composition can be used in removing cutting oils, greases, greasy dirt, solder fluxes, waxes, tape residues, coolants, lubricants, lapping compounds, cuttings turnings, chips and other machining residues from machined parts and for hard surface cleaning in general. They can be used advantageously to clean metals, plastics and electronic assemblies.

The ester cleaning composition of the present invention can be used in cleaning effectively printed circuit boards, as well as any type of substrate which is contaminated with soldering flux and/or other types of residue that typically contaminate the surfaces of printed circuit boards, for example, adhesive tape residue, waxes and fingerprints. Thus, printed wiring boards and other articles which require the use of soldering flux in the making of mechanical, electromechanical or electronic connections with metal can be cleaned in accordance with the present invention. In the fabrication of such articles, rosin soldering flux is used widely. However, there also can be used other types of soldering fluxes, including, for example, synthetic activated fluxes, organic acid-based fluxes and fluxes contained within soldering paste.

With respect to the degree of substrate cleanliness that can be achieved by the practice of the present invention, levels of contamination that meet or are below the military specification MIL-P-28809A requirement of 14 micrograms NaCl equivalent/square inch can be achieved. The ester cleaning composition has been used effectively to provide substrates having a contamination level below about 10 micrograms NaCl equivalent/square inch.

The contaminated surface should be contacted with the cleaning composition for a period of time sufficient to solubilize the contaminant. The time for effecting solubilization will depend on the temperature of the cleaning composition and the means by which it is applied. The temperature of the composition can be like that typically used for conventional cleaning compositions, for example, room or ambient temperature (about 70° F.) to about 150° F. For some applications, for example, wax removal, even higher temperatures can be used, for example, up to about 240° F. Exemplary means for applying the cleaning composition are immersion, brushing, and spraying, for example, spraying in air or beneath the surface of the cleaning composition. It is believed that spraying the cleaning composition onto the substrate will be used most widely. For batch operations, typical contact times are about 1 to about 10 minutes. For continuous operations, typical contact times are about 30 seconds to about 3 minutes.

The solubilized contaminant and residual cleaning composition can be removed from the substrate by any suitable means, for example, by air blasting, rinsing with water or an organic rinsing agent, or by wiping, for example, with an absorbent material. It should be understood that, for some applications, it is not necessary to remove completely the cleaning composition and the contaminate from the substrate. In such an application, the cleaning composition is simply allowed to drain from the surface.

Drying of the substrate is optional. If it is desired to dry the surface, drying can be accelerated by the use of heat. For example, the substrate can be dried in an oven and/or it can be dried with forced air, for example, air heated to 100° F. or above.

In accordance with this invention, it has been found that the monobasic ester cleaning composition can be used effectively to clean a plurality of parts even after prolonged use with build up in the composition of a relatively high amount of dissolved organic contaminants that have been removed from the treated parts. In one application, it was observed that a bath of the cleaning composition continued to clean effectively parts covered with an oily material even though the bath contained about 40 wt. % of the dissolved organic residue. Accordingly, the present invention encompasses also the continued use of the monobasic ester composition to clean organic residues from the surfaces of substrates contacted therewith as dissolved organic residue builds up in concentration in the composition to a relatively high amount, but preferably to an amount no greater than about 30 wt. %, and more preferably to an amount of about 20 wt. % (based on the total weight of the cleaning composition and the amount of dissolved organic contaminant).

EXAMPLES OF THE MONOBASIC ESTER DEVELOPMENT

Examples which follow are illustrative of the present invention. Comparative examples are set forth also.

The first example is a comparative example which shows the use of CFC-113 (hereinafter "the CFC composition"), an example of a prior art cleaning composition comprising 1,1,2-trichlorotrifluoroethane. This comparative example is followed by an example of the present invention showing the use of a cleaning composition containing a monobasic ester to clean the same type of machine parts as were cleaned by the use of CFC composition.

Example C-1

In machining operations during the manufacture of component parts of automotive fuel injectors, the parts being machined are subjected to statistical in-process quality control measurements for dimensional conformity. The parts were taken from the machine and swished by hand in a container of the CFC composition to remove cutting oil, chips and grinding residues. The chips and grinding residues settled to the bottom of the container and the cutting oil dissolved in the CFC composition. The parts were blown off with a jet of air to remove the residual CFC composition. The parts were then placed in a laser gauge to measure dimensional conformity.

Example 1

A cleaning composition comprising 95 wt. % isopropyl myristate and 5 wt. % of other unidentified monobasic esters (by-products of the manufacturing process) hereafter "the ester composition") was substituted for the CFC-113 composition. The fuel injectors were taken from the machine and swished in the container of the ester composition. The machine operators were in direct contact with the ester composition during this cleaning operation. The chips and grinding residues settled to the bottom of the container and the cutting oil dissolved in the ester composition. The parts were blown off with a jet of air to remove the residual ester composition and then placed in the laser gauge to measure dimensional conformity.

The measurements in the laser gauge were the same, and performed in the same manner, as those associated with the parts cleaned with the CFC composition. The ester composition functioned as a drop-in replacement for the CFC composition, with no harmful effects on the workers.

Since the flash point of the ester composition of Example 1 is 285° F., the potential for explosion or fire was not present as a result of the replacement. However, a very significant cost saving was achieved in the replacement because there were no significant evaporative losses of the ester composition and the time interval for change of the ester composition in the container was extended by at least three times. The latter advantage was realized because the ester composition continued to remove the chips and grinding residues from the parts even though the concentration of cutting oil in the ester composition was more than three times greater than in the CFC composition. A further cost saving was achieved by arranging for a blow-off station to catch the mist which was blown off the parts after they were dipped in the ester composition. The captured mist was collected and the liquid was reused in the cleaning process.

The next example is a comparative example showing the use of a prior art, commercially available cleaning composition comprising mineral spirits. This comparative example is followed by an example which also shows the use of the ester composition of Example 1.

Example C-2

This example also involved the cleaning of components parts of automotive fuel injectors. The parts were subjected to various machining operations and then placed in the solvent manifolds of HAPA Galvanotechnik washing machines where a stream of mineral spirits (solvent) impinged on the parts to remove the cutting oil, chips and grinding residues. The chips and grinding residues were filtered continuously from the solvent in the machine and the cutting oil concentration built up in the solvent as the solvent cycled through the machine. The solvent was replaced in the machines twice per week during operation. During the cleaning operation involving the use of mineral spirits, the operators complained of headaches, nausea and dermatitis.

Example 2

The mineral spirits used in the washing machines referred to in Example C-2 was replaced with the ester composition of Example 1. The fuel injectors were cleaned in the same machine cycles without complaints of headaches, nausea or dermatitis from the machine operators. The risk of explosion or fire was greatly reduced because the flash point of the ester composition is 285° F., as compared to 104° F. for the mineral spirits. Furthermore, a drastic cost reduction was achieved because the solvent change-out frequency in the machines was extended from twice per week for the mineral spirits to once every two months for the ester composition. This was due to the ability of the ester composition to clean effectively even though loaded with about 10 wt. % cutting oil. Cost savings accrued also from other factors, such as reduced disposal costs, no evaporative losses and reduced machine down-time.

The next example is a comparative example which shows the use of a prior art, commercially available cleaning composition to clean transmission parts. The comparative example is followed by an example of the present invention showing also the effective use of a composition like that of Example 1. In these examples, residual cleaning composition was removed from the parts by blowing with a jet of air.

Example C-3

This example involved the cleaning of steel parts at the site of a warranty transmission rebuilder for the automotive industry. The cleaning composition comprised mineral spirits that was used in three different kinds of washing machines to clean transmission parts before reassembly. The consumption of the composition was at the rate of about 2,000 gallons per week. Along with headaches and nausea, 168 cases of dermatitis were reported during 12 months of use of the composition.

Example 3

The C-3 cleaning composition was replaced by the ester composition of Example 1. The transmission parts were cleaned with no reports of dermatitis, headaches or nausea. The transmission parts were more effectively cleaned with the ester composition as determined by the Sediment Test, a standard test used in the automotive transmission industry to evaluate cleanliness. The Sediment Test values were reduced by more than 60% when the ester composition was used in place of the C-3 composition. The potential for fire or explosion was greatly reduced because the flash point of the ester composition is 285° F., as compared to 108° F. for the C-3 composition. The consumption rate of the ester composition was 108 gallons per week whereas that of the C-3 composition was 2,000 gallons per week. Even though the ester composition is more costly than the C-3 composition, a cost savings of more than 58% was achieved in the conversion to the ester composition because of its reduced rate of consumption. The reduced consumption of the ester composition came about because it continued to clean effectively even though loaded with about 15 wt. % of residual oil.

The next example is a comparative example which shows the use of a prior art, commercially available CFC composition comprising about 94 wt. % 1,1,2-trichlorotrifluoroethane and about 6 wt. % methanol to clean solder flux of the rosin type from electrical parts. The comparative example is followed by an example which shows the use of a composition of the present invention to clean the aforementioned type of parts.

Example C-4

In this example, parts for small rotary electrical switches were made by soldering a small brass disk onto a small brass shaft. The solder flux, which congealed and hardened at the solder joint, was removed from the resulting part using a cleaning composition comprising 1,1,2-trichlorotrifluoroethane, that is, a halogenated solvent of the type that is associated with ozone depletion. The parts were cleaned by immersing them in the cleaning composition which was contained in a heated ultrasonic vat equipped with a vented hood exhaust system. The composition was removed by air drying.

Example 4

The composition of Example C-4 was replaced by a composition comprising approximately 90 wt. % isopropyl myristate and approximately 10 wt. % surfactant composition (Tergitol NP-4 (3.33 wt. %), Tergitol NP-7 (1.66 wt. %), Macol 2 (1.66 wt. %), Cyclogol SBDO (1.66 wt. %), and dipropylene glycol (1.66 wt. %). The solder flux was removed from the parts every bit as well with this composition as with the composition of Example C-4. The residual ester-based composition was removed from the parts by rinsing with tap water. No complaints of any health or safety problems were reported in the conversion to the use of the ester-based composition. Since the flash point of the ester-based composition is 285° F., the potential for fire or explosion was minimal. Very significant cost savings were achieved in the conversion from the composition of Example C-4 to the ester-based composition.

The next example is a comparative example which shows the use of a prior art, commercially available halogenated hydrocarbon solvent to clean brass parts. The comparative example is followed by an example which shows the use of a composition like that of Example 4 above to clean the same type of brass parts.

Example C-5

In this example, brass parts were fabricated by turning in high production screw machines. The cutting oil, chips and turnings, were removed from the fabricated parts in a vapor degreaser using 1,1,1-trichloroethane. The composition was removed from the brass parts by air drying.

Example 5

The cleaning process of Example C-5 was changed to one which provided for placing the fabricated parts from the screw machines into wire mesh baskets and then dipping the baskets of parts repeatedly in a container of the cleaning composition like the composition of Example 4. The composition effectively removed the cutting oil, chips and turnings from the parts. The residual composition was removed from the parts by rinsing with water. The ester-based composition was very well received by the operators handling and using it. No complaints of any health or safety problems were reported. Cost savings in the conversion were significant.

The next three examples are illustrative of the practice of the present invention and show some additional applications in which monobasic esters can be used effectively.

Example 6

Methyl laurate (100%) was used to clean small metal parts of metal chips and cutting oils. The parts were dipped in the methyl laurate, blasted with compressed air to remove excess liquid and soils, and gauged with measuring instruments to determine part dimensions. The results were deemed to be fully satisfactory relative to the use of a conventional chlorofluorocarbon (CFC-113).

Example 7

In this example, soiled laboratory uniforms were dry cleaned in a cleaning composition comprising 88 wt. % isopropyl myristate, 12 wt. % of a surfactant mixture consisting of Tergitol NP-4 (4 wt. %), Tergitol NP-7 (2% wt. %), Macol 2 (2 wt. %), cyclogol SBDO (2 wt. %), and dipropylene glycol (2 wt. %). Following the wash, the uniforms were rinsed in water. After drying, the uniforms were found to be satisfactorily clean.

Example 8

In this example, a cleaning composition comprising the methyl ester of capric acid was used to clean a printed wiring assembly which had been soldered using rosin flux. The cleaning performance was equivalent to that obtained with a terpene/surfactant mixture (BIOACT® EC-7™, Petroferm Inc.).

Thus, monobasic esters are useful as cleaning agents. They are capable of dissolving a variety of common contaminants and offer the advantages indicated earlier relative to other cleaning agents.

Terpene Development/Use of Monobasic Ester Preferred

An important characteristic of the present invention is that it is capable of being used effectively in an industrial cleaning process, as distinguished from a cleaning process that is simply carried out on a laboratory scale or a pilot-plant scale. The invention can be practiced in either a batch or continuous cleaning process.

Although it is expected that the invention will be used most widely in cleaning printed circuit boards, it has wider applicability in that it can be used to clean any type of substrate which is contaminated with soldering flux and/or other types of residue that typically contaminate the surfaces of printed circuit boards, for example, adhesive tape residue, waxes and fingerprints. Thus, printed wiring boards and other articles which require the use of soldering flux in the making of mechanical, electromechanical or electronic connections with metal can be cleaned in accordance with the present invention. In the fabrication of such articles, rosin soldering flux is used widely. However, there also can be used other types of soldering fluxes, including, for example, synthetic activated fluxes, organic acid-based fluxes and fluxes contained within soldering paste.

The terpene-based cleaning composition for use in the practice of the present invention comprises at least about 60 wt. % terpene, more preferably at least about 80 wt. % terpene, and most preferably about 85 to about 95 wt. % terpene. The composition can comprise about 100 wt. % terpene, but preferably is used in admixture with another constituent as described hereinbelow.

The terpene for use in the practice of the present invention is a terpene compound or a mixture of terpene compounds that are substantially water-insoluble and that are capable of dissolving the involved contaminants. The use of such terpene to clean printed circuit boards and related types of articles of contaminants is well known. For practice of the present invention, the use of para-menthadienes is preferred, with dipentenes being more preferred and limonene being most preferred. Excellent results have been achieved utilizing a mixture of terpene in which about 90 to about 95 wt. % of the mixture is limonene (the major portion being d-limonene), with the balance of the mixture being other terpene compounds.

A particularly preferred embodiment of the present invention comprises a terpene-based composition which includes also a monobasic ester, which is a material that is also substantially water insoluble, as mentioned hereinabove. Such esters generally comprise the reaction product of alkyl alcohols and fatty acids, for example, $C_1$ to about $C_6$ alkanols and about $C_8$ to about $C_{18}$ fatty acids. Preferably $C_1$ to $C_4$ alcohols are used. Preferred monobasic esters are methyl laurate, isopropyl laurate and methyl caprate.

The monobasic ester can comprise up to about 40 wt. % of the terpene-based composition, but preferably comprises up to about 20 wt. %, most preferably about 5 to about 15 wt. % of the composition. Particularly good results having been achieved with the use of about 10 wt. % of the ester.

It should be understood that a material different from a monobasic ester (an optional, but preferred ingredient) can also be included in the terpene-based cleaning composition. Such material is desirably one which meets the COD standards set forth herein. As mentioned above, the terpene-based cleaning composition is substantially free of water-soluble material, that is, according to the procedure described above, the COD of the water phase of a two-phase mixture of equal amounts of the terpene-based cleaning composition and water is not greater than anbout 1000 ppm.

The contaminated surface should be contacted with the cleaning composition for a period of time sufficient to solubilize the contaminant. The time for effecting solubilization will depend on the temperature of the cleaning composition and the means by which it is applied. The temperature of the composition can be like that typically used for terpene-based compositions in applications of the present type, for example, room or ambient temperature (about 70° F.) to about 150° F. Exemplary means for applying the cleaning composition are immersion, brushing, and spraying, for example, spraying in air or beneath the surface of the cleaning composition. It is believed that spraying the cleaning composition onto the substrate will be used most widely. For batch operations, typical contact times are about 3 to about 5 minutes. For continuous operations, typical contact times are about 30 seconds to about 2 minutes.

The solubilized contaminant is removed from the terpene-treated substrate by contact with water having a temperature of about 70° F. to about 140° F. Good and satisfactory results have been obtained utilizing rinse water at room temperature. Water-contact times of the type generally used in the art can be used, for example, not longer than about 10 minutes. Preferably, the water-contact time does not exceed about 5 minutes. Good results have been achieved with a contact time of about two minutes.

Conventional means can be used to apply the water. It is believed that, for most applications, spraying the air-borne substrate will be satisfactory and convenient. A spray pressure of about 30 to about 50 psi is exemplary. Other means for applying the water can be used also, for example, ultrasonic water agitation.

After the solubilized contaminants have been removed from the substrate, the substrate is dried. Typically, drying will be accelerated by the use of heat. For example, the substrate can be dried in an oven and/or it can be dried with forced air, for example, heated to 100° F. or above.

With respect to the degree of substrate cleanliness that can be achieved by the practice of the present invention, levels of contamination that meet or are below the military specification MIL-P-28809A requirement of 14 micrograms NaCl equivalent/square inch can be achieved. The invention has been used effectively to provide substrates having a contamination level below about 10 micrograms NaCl equivalent/square inch.

It should be understood that such low levels of contamination can be achieved without the use of a surfactant in the water which is used to remove the solubilized contaminant from the substrate. Indeed, the COD of such water should be such as to meet the COD requirements set forth herein. Deionized water is used preferably.

The effluent produced by the cleaning process comprises a liquid mixture of the terpene-based cleaning composition, contaminant dissolved therein, and water. The liquid mixture may contain some solids, for example, minute pieces of solder and miscellaneous debris. The nature of the liquid mixture produced in accordance with the present invention is such that the components thereof can be separated conveniently by gravitational force. Thus, upon being fed to a settling tank, solids precipitate from the mixture and the liquid components thereof stratify into a top layer comprising the water insoluble or immiscible liquids, that is, terpene and organic materials dissolved therein, including contaminants, and an aqueous bottom layer. The nature of the process is such that the aqueous layer is substantially free of water-soluble organic material, that is, it has a COD of no greater than about 1000 ppm. Indeed, the process of the present invention can be utilized effectively to provide an aqueous phase in which the COD thereof is about 300 ppm or less, for example, no greater than about 150 ppm. And, this can be accomplished without subjecting the water to any purifying steps or dilution.

In separating the different phases of the liquid mixture, the top organic layer can be simply drawn off. If desired, the aqueous phase can then be discharged directly into the sewage system, while meeting the COD demands imposed by the involved governmental agency. If desired, the aqueous phase can be recycled for reuse in the cleaning process. This will generally involve the steps of filtration to separate solids and ion exchange to remove undesirable inorganic materials, the latter step being preceded by carbon adsorption (if necessary) to remove organic materials that may adversely affect the ion exchange step. Other means may be used to purify the water.

Other means can be used to separate the liquid phases of the mixture, for example, centrifugation or by use of appropriate membranes.

The terpene compounds can be treated for recycling or they can be disposed of in an appropriate way, for example, incineration.

EXAMPLES OF TERPENE DEVELOPMENT

This example is illustrative of the practice of the present invention.

Example A

A set of three identical printed circuit boards was fluxed with a rosin soldering flux (ALPHA 627 flux sold by Alpha Metals Inc. of Jersey City, N.J.), wave soldered, and then cleaned of the flux residue that was adhered to each of the boards.

The cleaning composition contained terpene which were derived from orange peels and which comprised about 95 wt. % limonene and 5 wt. % of a mixture of other terpene compounds. The cleaning composition was substantially free of water-soluble organic materials. The boards were placed in the rack of an industrial dishwasher (semi-aqueous cleaning module) sold by Electronic Controls Design as Model 6307. The cleaning operation involved spraying the boards for about 5 minutes with the cleaning composition which was at room temperature (about 75° F.).

The terpene-treated boards were then rinsed with water to remove the cleaning composition and flux dissolved therein. This was accomplished by subjecting the boards to a 1-minute, 20-second water wash in a continuous process carried out in an Electrovert H-500 water rinse unit sold by Electrovert of Arlington, Tex. The spray pressure was about 40 pounds/square inch. The temperature of the water was about 120° F. The water collected from the rinsing operation has a COD well below 1000 ppm. Thereafter, each of the cleaned boards was dried with hot air.

The cleanliness of each of the boards was evaluated by use of an Omega meter 600 SMD ionic testing device (sold by Alpha Metals Inc.). The average for the three boards was a contamination reading of only 9.3 micrograms NaCl equivalent/square inch.

The next example is a comparative example which is illustrative of a prior art process.

Example No. C-A

The same procedure as described in Example No. 1 above was followed except that cleaning was effected with a composition comprising 90 wt. % of the terpene cleaning composition described in Example 1 above and 10 wt. % of a mixture of emulsifying surfactants. The mixture comprised 50 wt. % of an ethoxylated sorbitan ester and 50 wt. % of an ethoxylated linear alcohol. The average for the three boards that were cleaned was a reading of 9.4 micrograms NaCl equivalent/square inch—essentially the same as that of the boards of Example No. 1. However, the rinse water has a COD in excess of 5,000 ppm.

We claim:

1. A method for removing an organic residue of soldering flux from a metallic or plastic surface contaminated therewith comprising:

(A) contacting the surface with a cleaning composition consisting essentially of a substantially water-insoluble monobasic acid ester present in an amount in excess of 50 wt. % of the composition and having the formula

   RCOOR₁ wherein R is an alkyl group having about 8 to about 16 carbon atoms and $R_1$ is an alkyl group having 1 to about 4 carbon atoms;

(B) maintaining the cleaning composition in contact with the surface for a period of time at least sufficient to solubilize the residue; and (C) removing cleaning composition and solubilizing residue from the surface.

2. A method according to claim 1 wherein said composition is used to clean a plurality of parts having their surfaces contaminated with said residue and wherein said residue is dissolved by said composition and wherein said dissolved residue builds up in concentration in said composition as the composition is used to clean additional parts and continuing to use said composition to clean additional parts when the concentration of the dissolved residue is about 20 to about 40 wt. %.

3. A method according to claim 2 including continuing to use said composition to clean additional parts when the concentration of the dissolved residue is about 20 to about 30 wt. %.

4. A method according to claim 1 wherein the total number of carbon atoms in R and $R_1$ is about 9 to about 17.

5. A method according to claim 1 wherein the monobasic ester is methyl laurate, isopropyl laurate, methyl caprate, or isopropyl myristate.

6. A method according to claim 1 wherein the surface is contacted with a cleaning composition having a temperature of about 70° F. to about 240° F. for a period of time of no longer than about 10 minutes to provide a surface having a contamination rating of no greater than about 14 micrograms NaCl equivalent/square inch (MIL-P-28809A).

7. A method according to claim 1 wherein said monobasic ester has a flash point of greater than about 140° F.

8. A method according to claim 1 wherein said monobasic ester has a flash point of greater than about 200° F.

9. A method according to claim 1 wherein said surface is the surface of a printed circuit board.

10. A method according to claim 9 wherein the cleaned surface has a contamination rating of no greater than about 14 micrograms NaCl equivalent/square inch (MIL-P-28809A).

11. A method according to claim 1 wherein the cleaning composition further comprises a surfactant.

12. An industrial cleaning process in which a contaminant of soldering flux or wax is removed from a substrate contaminated therewith, comprising:

(A) contacting the substrate with a cleaning composition consisting essentially of a substantially water-insoluble monobasic acid ester present in an amount in excess of 50 wt. % of the composition and having the formula

RCOOR$_1$ wherein R is an alkyl group having about 8 to about 16 carbon atoms and R$_1$ is an alkyl group having 1 to about 4 carbon atoms;

(B) maintaining the cleaning composition in contact with the substrate for a period of time at least sufficient to solubilize the contaminant;

(C) removing a mixture of the cleaning composition and solubilized contaminant from the substrate by contact with water to provide a substrate having a contamination rating of no greater than about 14 micrograms NaCl equivalent/square inch (MIL-P-28809A); and (D) separating the water from said mixture, the separated water being substantially free of water-soluble organic material and having a chemical oxygen demand of no greater than about 1,000 ppm.

13. A method according to claim 12 in which the cleaning composition has a temperature of about 70° F. to about 240° F. and wherein the substrate is contacted with said cleaning composition for a period of time of no longer than about 10 minutes and wherein the substrate has a contamination rating of below about 10 micrograms.

14. A method according to claim 12 wherein the monobasic ester has a flash point of greater than about 140° F.

15. A process according to claim 12 wherein the monobasic ester is methyl laurate, isopropyl laurate, methyl caprate, or isopropyl myristate.

16. A method for removing wax from a metallic or plastic surface contaminated therewith comprising:

(A) contacting the surface having thereon wax with a cleaning composition consisting essentially of a substantially water-insoluble monobasic acid ester present in an amount in excess of 50 wt. % of the composition and having the formula

RCOOR$_1$ wherein R is an alkyl group having about 8 to about 16 carbon atoms and R$_1$ is an alkyl group having 1 to about 4 carbon atoms;

(B) maintaining the cleaning composition in contact with the surface for a period of time at least sufficient to solubilize the wax; and (C) removing cleaning composition and solubilized wax from the surface.

17. A method according to claim 16 wherein the cleaning composition further comprises a surfactant.

18. A method according to claim 17 wherein the monobasic ester comprises isopropyl myristate.

19. A method according to claim 16 wherein the surface is contacted with a cleaning composition having a temperature of about 70° F. to about 240° F. for a period of time of no longer than about 10 minutes to provide a surface having a contamination rating of no greater than about 14 micrograms nacl equivlent/square inch (MIL-P-28809A).

20. A method for removing residue which includes soldering flux from a metallic or plastic surface contaminated therewith comprising:

(A) contacting the surface with a cleaning composition consisting essentially of: (1) a substantially water-insoluble monobasic acid ester present in an amount in excess of 50 wt. % of the composition and having the formula

RCOOR$_1$ wherein R is an alkyl group having about 8 to about 16 carbon atoms and R$_1$ is an alkyl group having 1 to about 4 carbon atoms; and (2) another cleaning agent selected from the group consisting of dibasic esters, petroleum hydrocarbons, ketones, ethers and alcohols in an amount less than 50 wt. % of the composition;

(B) maintaining the cleaning composition in contact with the surface for a period of time at least sufficient to solubilize the residue; and (C) removing cleaning composition and solubilized residue from the surface.

21. A method according to claim 20 wherein said composition includes about 55 to about 90 wt. % of the monobasic ester and about 10 to about 45 wt. % of said other cleaning agent.

22. A method according to claim 20 including also a surfactant.

23. A method according to claim 22 wherein said surfactant is present in an amount of about 2 to about 20 wt. % of the composition.

24. A method according to claim 23 wherein the surfactant comprises about 8 to 12 wt. % of the composition.

25. A method according to claim 23 wherein the monobasic ester is either methyl laurate, isopropyl laurate, methyl caprate or isopropyl myristate and said surfactant is an ethoxylated alkylphenol or a detergent alcohol.

* * * * *

UNITED STATES PATENT AND TRADEMARK OFFICE
CERTIFICATE OF CORRECTION

PATENT NO. : 5,849,106
DATED : December 15, 1998
INVENTOR(S) : Paul L. Bolden, Michael E. Hayes & John E. Braddy It is certified that error appears in the above-identified patent and that said Letters Patent is hereby corrected as shown below:

Column 18, line 44, after "to", insert --about--.

Signed and Sealed this

Eighteenth Day of May, 1999

Attest:

Q. TODD DICKINSON

Attesting Officer      Acting Commissioner of Patents and Trademarks